(12) United States Patent
Otsuki et al.

(10) Patent No.: US 9,257,541 B2
(45) Date of Patent: Feb. 9, 2016

(54) HIGH-BREAKDOWN-VOLTAGE POWER SEMICONDUCTOR DEVICE HAVING A DIODE

(71) Applicant: MITSUBISHI ELECTRIC CORPORATION, Tokyo (JP)

(72) Inventors: Eiko Otsuki, Tokyo (JP); Koji Sadamatsu, Tokyo (JP); Yasuhiro Yoshiura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 62 days.

(21) Appl. No.: 13/950,168

(22) Filed: Jul. 24, 2013

(65) Prior Publication Data

US 2014/0091359 A1    Apr. 3, 2014

(30) Foreign Application Priority Data

Oct. 2, 2012  (JP) ................. 2012-220488

(51) Int. Cl.
*H01L 29/66* (2006.01)
*H01L 29/739* (2006.01)
*H01L 29/40* (2006.01)
*H01L 29/861* (2006.01)
*H01L 29/06* (2006.01)

(52) U.S. Cl.
CPC ........ *H01L 29/7393* (2013.01); *H01L 29/0619* (2013.01); *H01L 29/0638* (2013.01); *H01L 29/402* (2013.01); *H01L 29/8611* (2013.01)

(58) Field of Classification Search
CPC ............. H01L 29/0619; H01L 29/861; H01L 2924/0002; H01L 29/8611; H01L 21/263; H01L 21/67115; H01L 21/67718; H01L 21/67745; H01L 21/6776; H01L 21/68; H01L 2924/00; H01L 29/32; H01L 29/36
See application file for complete search history.

(56) References Cited

U.S. PATENT DOCUMENTS

| 5,969,400 A | * | 10/1999 | Shinohe et al. ................ 257/492 |
| 6,177,713 B1 | * | 1/2001 | Aono et al. .................... 257/490 |
| 2003/0067033 A1 | | 4/2003 | Kinoshita et al. |
| 2004/0173820 A1 | | 9/2004 | Kinoshita et al. |

(Continued)

FOREIGN PATENT DOCUMENTS

| JP | 07-221326 A | 8/1995 |
| JP | H08-293618 A | 11/1996 |

(Continued)

OTHER PUBLICATIONS

An Office Action; "Grounds for Rejection," issued by the Korean Patent Office on Jul. 2, 2014, which corresponds to Korean Patent Application No. 10-2013-0112976 and is related to U.S. Appl. No. 13/950,168; with English language translation.

(Continued)

*Primary Examiner* — Robert Bachner
(74) *Attorney, Agent, or Firm* — Studebaker & Brackett PC

(57) ABSTRACT

A semiconductor device includes a semiconductor substrate having one main surface in which an anode of a diode is formed. At a distance from the outer periphery of the anode, a guard ring is formed to surround the anode. The anode includes a $p^+$-type diffusion region, a $p^-$-type region, and an anode electrode. The $p^-$-type region is formed as a region of relatively high electrical resistance sandwiched between the $p^+$-type diffusion regions.

9 Claims, 15 Drawing Sheets

(56) References Cited

U.S. PATENT DOCUMENTS

| | | | |
|---|---|---|---|
| 2006/0131685 A1* | 6/2006 | Watanabe et al. | ............. 257/483 |
| 2009/0212301 A1 | 8/2009 | Zhang et al. | |
| 2009/0289276 A1 | 11/2009 | Yoshiura et al. | |

FOREIGN PATENT DOCUMENTS

| | | | |
|---|---|---|---|
| JP | 2000-114550 A | 4/2000 |
| JP | 2001-094095 A | 4/2001 |
| JP | 2003-101039 A | 4/2003 |
| JP | 2011-514674 A | 5/2011 |
| KR | 2000-0011235 A | 2/2000 |
| KR | 2009-0122106 A | 11/2009 |

OTHER PUBLICATIONS

An Office Action; "Notice of Allowance," issued by the Korean Patent Office on Jan. 12, 2015, which corresponds to Korean Patent Application No. 10-2013-0112976 and is related to U.S. Appl. No. 13/950,168; with English language translation.

* cited by examiner

HIGH-BREAKDOWN-VOLTAGE POWER SEMICONDUCTOR DEVICE HAVING A DIODE

BACKGROUND OF THE INVENTION

1. Field of the Invention

The present invention relates to a semiconductor device, and particularly to a high-breakdown-voltage power semiconductor device having a diode.

2. Description of the Background Art

In these years, inverters are used in those fields such as the field of industrial power units. For the inverter, usually a commercial power supply (AC power supply) is used. Thus, the inverter includes a converter unit first converting an AC voltage into a DC voltage (forward conversion), a smoothing circuit unit, and an inverter unit converting the DC voltage into an AC voltage (inverse conversion). As a main power device in the inverter unit, an insulated gate bipolar transistor (hereinafter referred to as "IGBT") capable of performing a switching operation at a relatively high speed is chiefly applied.

In most cases, the load of the inverter is an electric induction machine (motor which is an inductive load). The inductive load is connected to a point of an intermediate potential between an upper arm element and a lower arm element, and electric current is caused to flow to the inductive load in both the positive and negative directions. Therefore, in order to direct the current flowing in the inductive load from the end to which the load is connected back to the power supply of a higher potential and to direct the current from the end to which the load is connected to the ground, a freewheel diode for circulating the current between the inductive load and a closed circuit of the arm elements is required.

In the inverter, usually the IGBT is operated as a switching device to repeat an OFF state and an ON state so as to control the power energy. Regarding the switching of the inverter circuit with an inductive load, the ON state is reached through a turn-on process while the OFF state is reached through a turn-off process. Here, the turn-on process refers to a transition of the IGBT from the OFF state to the ON state while the turn-off process refers to a transition of the IGBT from the ON state to the OFF state. While the IGBT is the ON state, current does not flow through the diode and the diode is the OFF state. In contrast, while the IGBT is the OFF state, current flows through the diode and the diode is the ON state.

In the following, a structure and an operation of a conventional diode will be described. In the conventional diode, an anode including a p-type diffusion region is formed in one main surface of an n-type low-concentration semiconductor substrate. In the other main surface of the semiconductor substrate, a cathode including an n+-type high-concentration region is formed. In order to ensure a breakdown voltage of the diode while a voltage is applied between the cathode and the anode, the diode including a guard ring (p-type region) is commonly and widely used. The guard ring is formed at a distance from the outer periphery of the anode (p-type diffusion region) so that the guard ring surrounds the anode, and accordingly an electric field in an anode's end portion located on the outer periphery side of the anode is reduced.

In the ON state where a high voltage is applied in the forward direction between the anode and the cathode, many carriers are accumulated in an n-type region (drift layer) of the semiconductor substrate. In contrast, in the OFF state where a high voltage is applied in the reverse direction between the anode and the cathode (at the time of reverse recovery), the carriers accumulated in the drift layer are discharged so that a reverse recovery current flows. At this time, a large current and a large voltage are applied to the diode, and accordingly heat is generated which is accompanied by large power consumption. This is one of the causes of hindrance to fast switching.

Documents disclosing a power semiconductor device having a diode are, for example, Japanese National Patent Publication No. 2011-514674, Japanese Patent Laying-Open No. 2000-114550, Japanese Patent Laying-Open No. 2003-101039, and Japanese Patent Laying-Open No. 07-221326.

SUMMARY OF THE INVENTION

The conventional semiconductor device, however, has the following problem. When the diode is the ON state, carriers are diffused and accumulated not only in a region of the drift layer that is located immediately under the anode but also in a region of the drift layer that is located immediately under the guard ring.

When a change is made from the ON state to the OFF state, the carriers accumulated in the drift layer are discharged from the anode or cathode, for example, and disappear in the end. At this time, into the p-type diffusion region of the anode, both the carriers (holes) accumulated in the region of the drift layer immediately under the anode and the carriers (holes) accumulated in the region of the drift layer immediately under the guard ring flow. In particular, the holes flow concentratively into the end portion of the anode. Therefore, electric field concentration and accordingly temperature increase occur to the end portion of the anode, resulting in a possibility that the diode is broken.

The present invention has been made to solve the above-described problem, and an object of the invention is to provide a semiconductor device in which current concentration in the end portion of the anode is suppressed.

A semiconductor device according to the present invention includes a semiconductor substrate, an anode, a guard ring, and a cathode. The semiconductor substrate has a first main surface and a second main surface opposite to each other. The anode is formed in the first main surface of the semiconductor substrate. The guard ring is formed in the first main surface of the semiconductor substrate and at a distance from an outer periphery of the anode to surround the anode. The cathode is formed in the second main surface of the semiconductor substrate. The anode includes, in its end portion located at the outer periphery, a region of relatively high impurity concentration and a region of relatively low impurity concentration.

In the semiconductor device according to the present invention, current concentration in the end portion of the anode of the diode can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
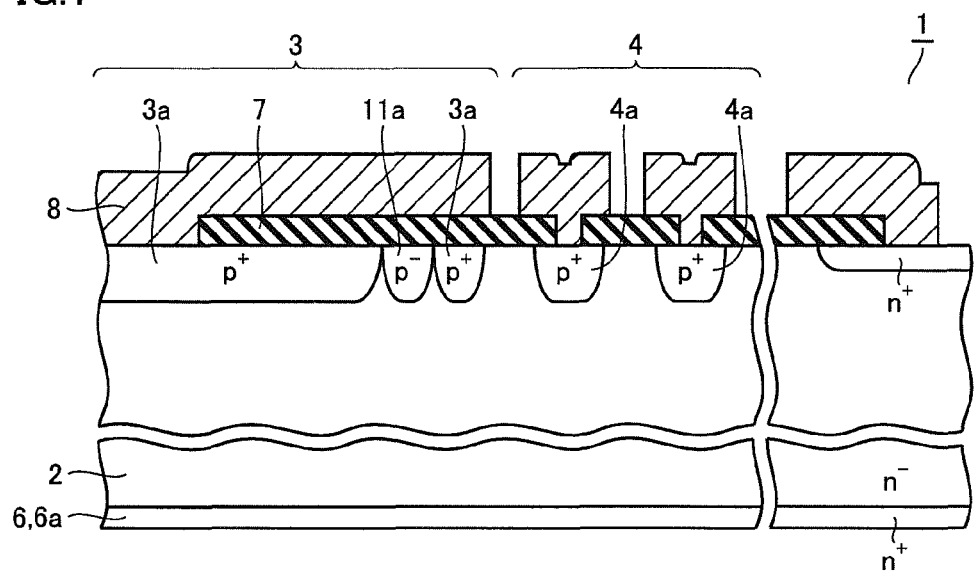
FIG. 1 is a cross-sectional view of a power semiconductor device having a diode in a first embodiment of the present invention.

A power semiconductor device having a diode in a first embodiment of the present invention will be described. As shown in FIG. 1, semiconductor device 1 includes an $n^-$-type low-concentration semiconductor substrate 2 having one main surface in which an anode 3 of the diode is formed. At a distance from the outer periphery of anode 3, a guard ring 4 is formed to surround anode 3. Anode 3 includes a $p^+$-type diffusion region 3a, a $p^-$-type region 11a, and an anode electrode 8. Guard ring 4 includes a $p^+$-type region 4a. Meanwhile, semiconductor substrate 2 has the other main surface in which a cathode 6 is formed. Cathode 6 includes an $n^+$-type high-concentration region 6a.

The structure of anode 3 will be described in more detail. $P^-$-type region 11a is formed in an end portion of anode 3. The end portion is located on the outer periphery side of anode 3. $P^-$-type region 11a is formed as a region of relatively high electrical resistance sandwiched between $p^+$-type diffusion regions 3a. $P^+$-type diffusion region 3a and $p^-$-type region 11a are formed from the one main surface to the same depth. Here, the same depth is not intended to mean exactly the same depth but includes a manufacturing tolerance. Moreover, $p^+$-type region 11a has its surface covered with an insulating film 7.

$P^-$-type region 11a has an impurity concentration that is set lower than the impurity concentration of $p^+$-type diffusion region 3a. $P^+$-type diffusion region 3a has an impurity concentration, for example, on the order of $1 \times 10^{16}/cm^3$ to $1 \times 10^{18}/cm^3$. $P^-$-type region 11a has an impurity concentration, for example, on the order of $1 \times 10^{14}/cm^3$ to $1 \times 10^{16}/cm^3$. It should be noted that $n^-$-type low-concentration semiconductor substrate 2 has an impurity concentration, for example, on the order of $1 \times 10^{13}/cm^3$ to $1 \times 10^{14}/cm^3$. Moreover, $n^+$-type high-concentration region 6a has an impurity concentration, for example, on the order of $1 \times 10^{18}/cm^3$ to $1 \times 10^{20}/cm^3$.

In the following, an operation of the above-described semiconductor device will be described. In a diode of an inverter circuit, an ON state and an OFF state occur by turns repeatedly in response to a switching operation of the IGBT. When the IGBT is the ON state, the diode is the OFF state. When the IGBT is the OFF state, the diode is the ON state.

Figure 2:
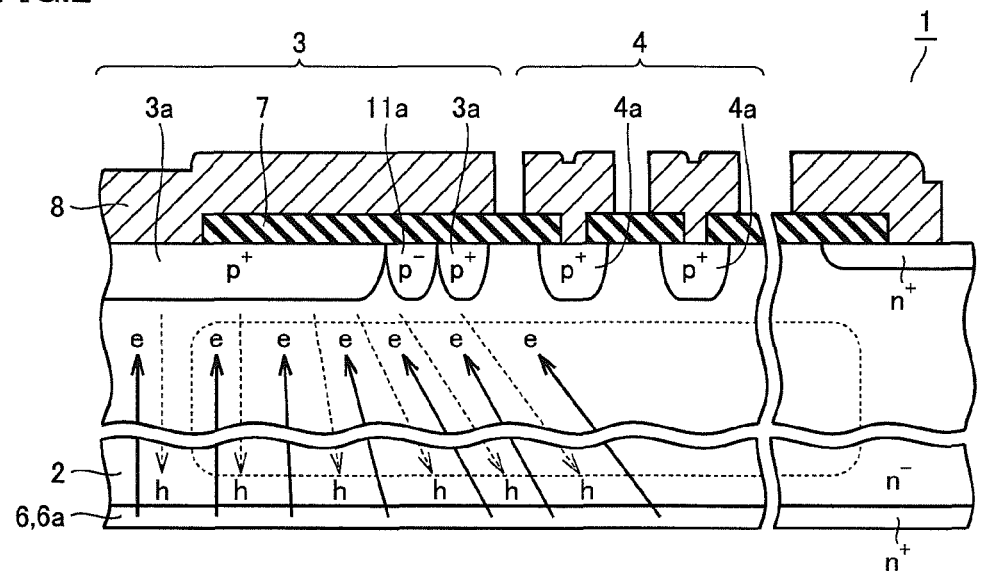
FIG. 2 is a cross-sectional view showing flow of carriers for illustrating an ON operation of the semiconductor device in the first embodiment.

In the ON state in which a high voltage is applied in the forward direction between anode 3 and cathode 6 of the diode, many carriers are accumulated as shown in FIG. 2 in an $n^-$-type region (drift layer) of semiconductor substrate 2. Namely, holes are injected from $p^+$-type diffusion region 3a toward the drift layer of semiconductor substrate 2 and electrons are injected from n$^+$-type high-concentration region 6a toward the drift layer of semiconductor substrate 2.

Figure 3:
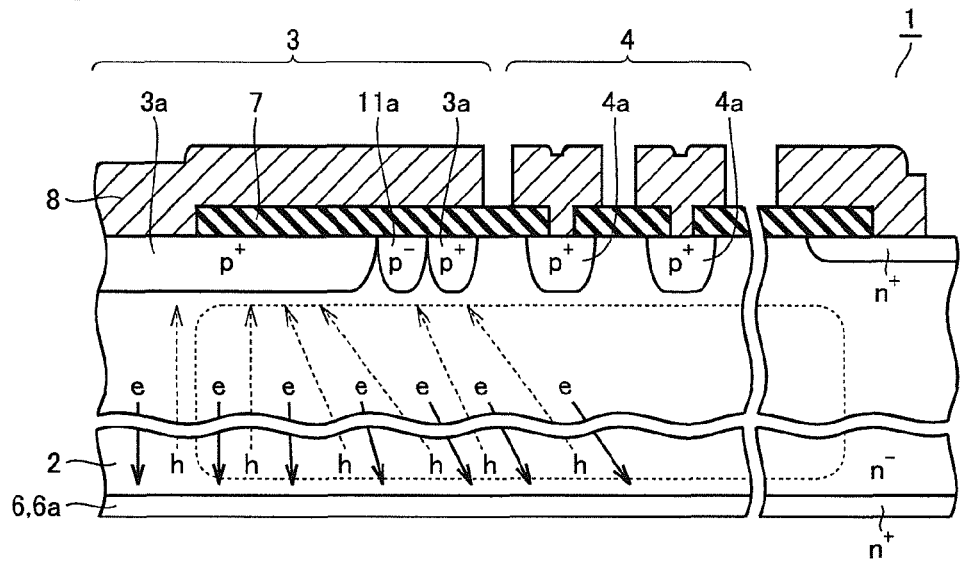
FIG. 3 is a cross-sectional view showing flow of carriers for illustrating an OFF operation of the semiconductor device in the first embodiment.

Then, application of a high voltage in the reverse direction between anode 3 and cathode 6 of the diode causes the diode to change from the ON state to the OFF state. As shown in FIG. 3, when the diode is to be changed from the ON state to the OFF state, of the carriers accumulated in the drift layer in the ON state, electrons are discharged from cathode 6 and holes are discharged from anode 3. A part of the electrons and a part of the holes are recombined to disappear, and the injected carries disappear in the end, which causes the OFF state.

In the end portion of anode 3 of semiconductor device 1 as described above, p$^-$-type region 11a of relatively low impurity concentration is formed. Thus, electric field concentration in the end portion of anode 3 can be alleviated. This will be described in connection with a semiconductor device of a comparative example.

The semiconductor device of the comparative example has a similar structure to the above-described semiconductor device except that the anode does not include p$^-$-type region 11a having a different impurity concentration from the impurity concentration of p$^+$-type diffusion region 3a.

Figure 4:
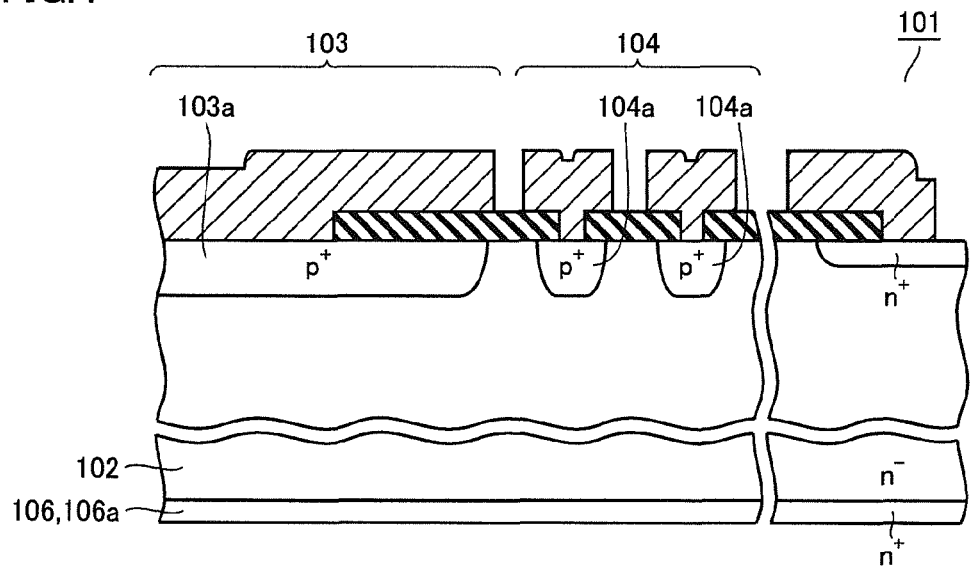
FIG. 4 is a cross-sectional view of a power semiconductor device having a diode in a comparative example.
Figure 5:
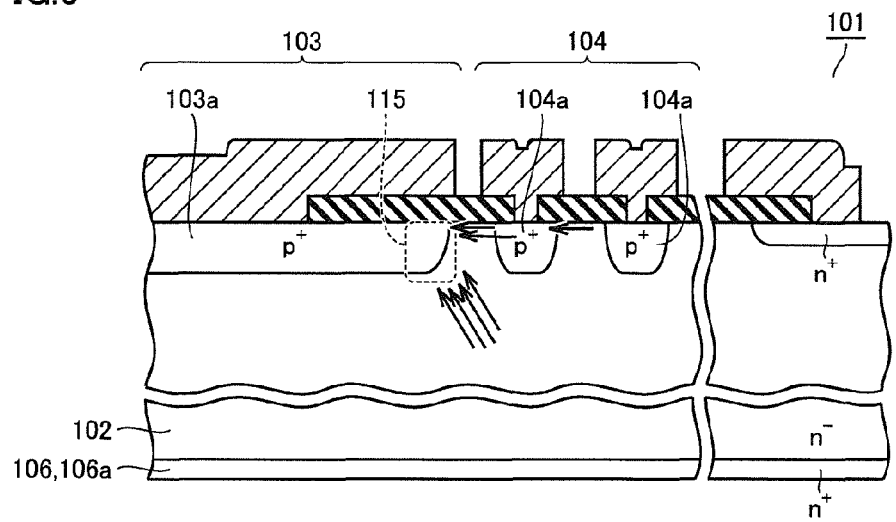
FIG. 5 is a cross sectional view showing behavior of carriers for illustrating an OFF operation of the power semiconductor device having a diode in the comparative example.

As shown in FIG. 4, a semiconductor device 101 includes a semiconductor substrate 102 having one main surface in which an anode 103 of a diode is formed.

At a distance from the outer periphery of anode 103, a guard ring 104 is formed to surround anode 103. Anode 103 includes a p$^+$-type diffusion region 103a. Guard ring 104 includes a p$^+$-type region 104a. Meanwhile, semiconductor substrate 102 has the other main surface in which a cathode 106 is formed. Cathode 106 includes an n$^+$-type high-concentration region 106a.

In the following, an operation of the semiconductor device in the comparative example will be described. In the ON state in which a high voltage is applied in the forward direction between anode 103 and cathode 106 of the diode, holes are injected from p$^+$-type diffusion region 103a toward an n-type region (drift layer) of semiconductor substrate 102 and electrons are injected from n$^+$-type high-concentration region 106a toward the drift layer of semiconductor substrate 102.

Then, application of a high voltage in the reverse direction between anode 103 and cathode 106 of the diode causes the diode to change from the ON state to the OFF state. At this time, of the carriers accumulated in the drift layer in the ON state, electrons are discharged from cathode 106 and holes are discharged from anode 103. Accordingly, the injected carries disappear in the end.

At this time, into p$^+$-type diffusion region 103a of anode 103, both the carriers (holes) accumulated in the drift layer immediately under anode 103 and the carriers (holes) accumulated in the drift layer immediately under guard ring 104 flow (reverse recovery current). Therefore, current concentrates particularly in an end portion (dotted-line box 115) of p$^+$-type diffusion region 103a that is located in the direct vicinity of guard ring 104.

Figure 6:
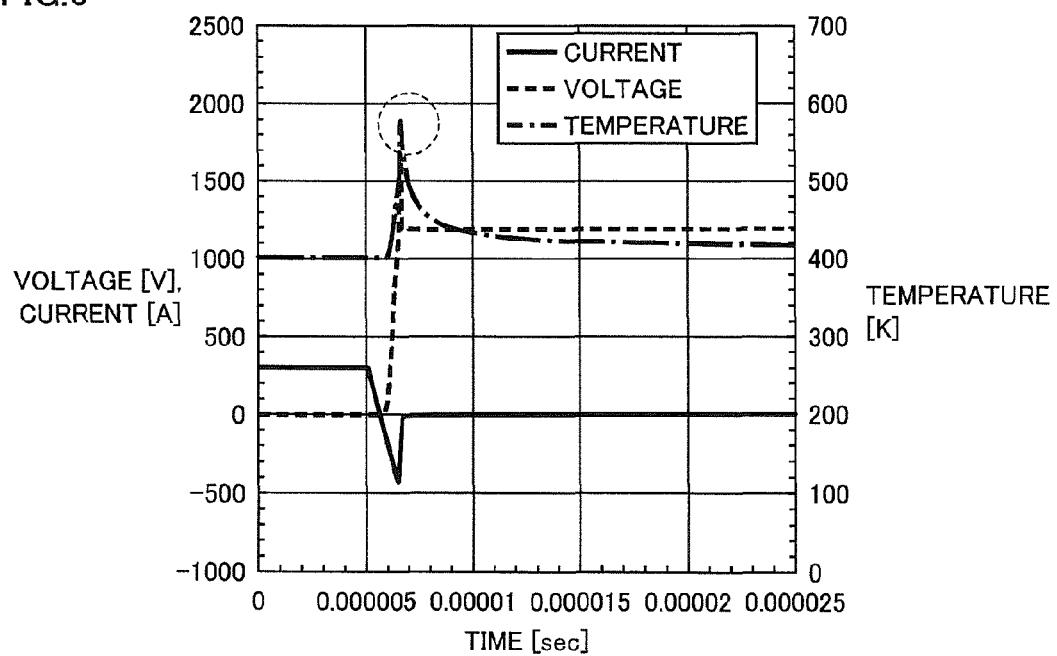
FIG. 6 is a graph showing respective changes, with time, of current, voltage, and temperature when the power semiconductor device having a diode changes from the ON state to the OFF state in the comparative example.

Here, respective changes, with time, of the current flowing in the diode, the voltage applied to the diode, and the temperature of the diode when the diode changes from the ON state to the OFF state are shown in FIG. 6. As shown in FIG. 6, reverse recovery current (recovery current) flows in the diode when the diode changes from the ON state to the OFF state (see the solid line in the graph). At this time, carriers (holes) flow concentratively into the end portion (dotted-line box 115) of p$^+$-type diffusion region 103a. Due to this, an electric field concentrates in the end portion of the anode to cause the temperature of the diode to disadvantageously increase (see the alternate long and short dash line in the graph). Consequently, there arises a possibility of breakage of the diode.

In contrast to the semiconductor device of the comparative example, the above-described semiconductor device of the present embodiment includes p$^+$-type diffusion region 3a and p$^-$-type region 11a that are formed in the end portion of anode 3. The impurity concentration of p$^-$-type region 11a is lower than the impurity concentration of p+-type diffusion region 3a, and p$^-$-type region 11a is formed as a region having a higher electrical resistance than p$^+$-type diffusion region 3a so that p$^-$-type region 11a is sandwiched between p$^+$-type diffusion regions 3a. Moreover, p$^-$-type region 11a is formed from one main surface to the same depth as p$^+$-type diffusion region 3a.

Figure 7:
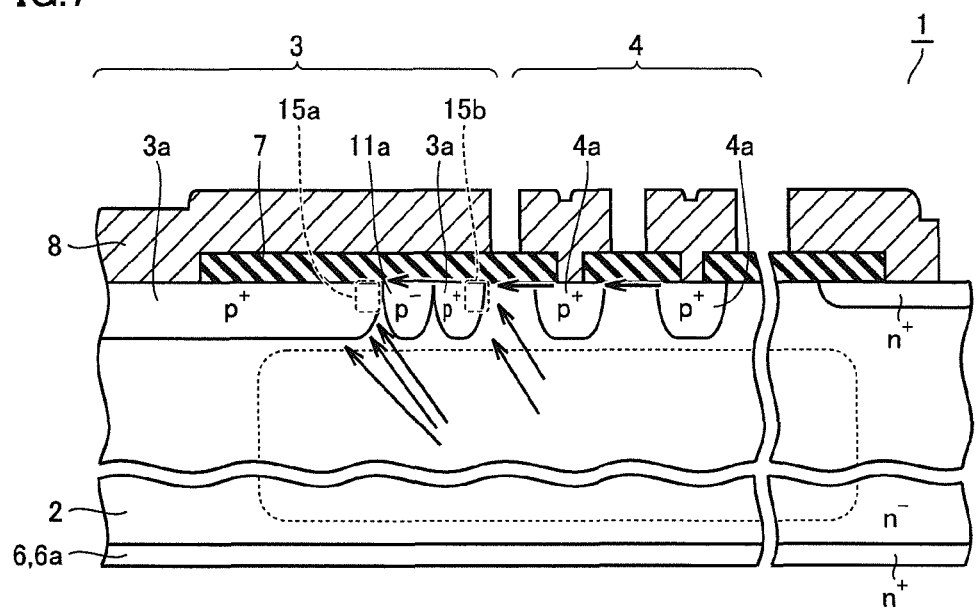
FIG. 7 is a cross-sectional view showing flow of carriers for illustrating the function and effect in the first embodiment.

Accordingly, when the diode changes from the ON state to the OFF state, current concentratively flows into at least two dispersed regions (dotted-line boxes 15a, 15b) in anode 3 as shown in FIG. 7. Since the regions into which current concentratively flows are dispersed, concentration of the electric field is alleviated. Consequently, a temperature increase of the diode is suppressed and the diode can be prevented from being broken.

Second Embodiment

A power semiconductor device having a diode in a second embodiment of the present invention will be described.

Figure 8:
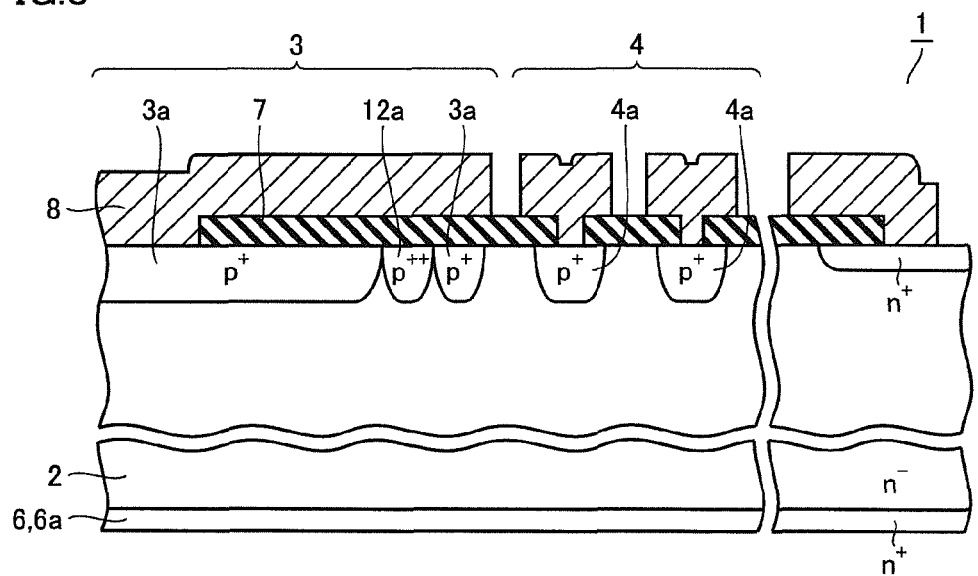
FIG. 8 is a cross-sectional view of a power semiconductor device having a diode in a second embodiment of the present invention.

As shown in FIG. 8, anode 3 includes a p$^1$-type diffusion region 3a and a p$^{++}$-type region 12a. P$^{++}$-type region 12a is formed, as a region of relatively low electrical resistance, in an end portion of anode 3. P$^{++}$-type region 12a is disposed so that it is sandwiched between p$^+$-type diffusion region 3a located on the guard ring 4 side and p$^+$-type diffusion region 3a located on the opposite side to the guard ring 4 side.

P$^+$-type diffusion region 3a and p$^{++}$-type region 12a are formed from one main surface to the same depth. Here, the same depth is not intended to mean exactly the same depth but includes a manufacturing tolerance. P$^{++}$-type region 12a has an impurity concentration that is set higher than the impurity concentration of p$^+$-type diffusion region 3a. P$^{++}$-type region 12a has an impurity concentration, for example, on the order of $1 \times 10^{18}/\text{cm}^3$ to $1 \times 10^{20}/\text{cm}^3$. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n$^-$-type region (drift layer) of semiconductor substrate 2, and electrons are injected from n$^1$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, p$^+$-type diffusion region 3a and p$^{++}$-type region 12a are formed. P$^{++}$-type region 12a is higher in impurity concentration than p$^+$-type diffusion region 3a, and is formed, as a region having a lower electrical resistance than p$^+$-type diffusion region 3a, so that p$^{++}$-type region 12a is sandwiched between p$^+$-type diffusion regions 3a. Moreover, p$^{++}$-type region 12a and p$^+$-type diffusion region 3a are formed from one main surface to the same depth. Namely, in the end portion of anode 3 of the diode, a region (p$^{++}$-type region 12a) of relatively low electrical resistance and a region (p$^+$-type diffusion region 3a) of relatively high electrical resistance are arranged.

Figure 9:
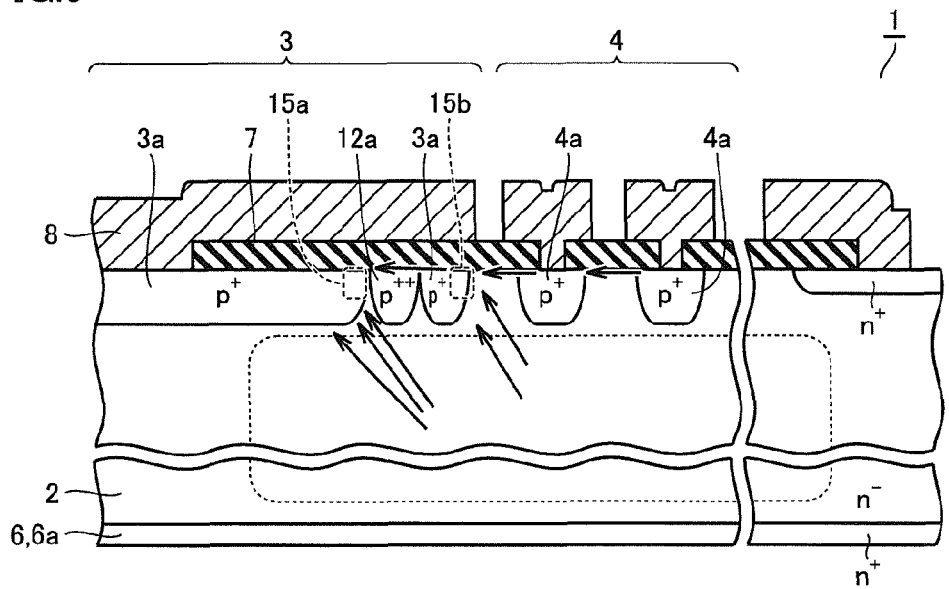
FIG. 9 is a cross-sectional view showing flow of carriers when a change is made from the ON state to the OFF state, for illustrating the function and effect in the second embodiment.

Accordingly, when the diode changes from the ON state to the OFF state, current concentratively flows into at least two dispersed regions (dotted-line boxes 15a, 15b) in anode 3 as shown in FIG. 9. Since the regions into which current concentratively flows are dispersed, concentration of the electric field is alleviated. Consequently, a temperature increase of the diode is suppressed and the diode can be prevented from being broken.

Third Embodiment

A power semiconductor device having a diode in a third embodiment of the present invention will be described.

Figure 10:
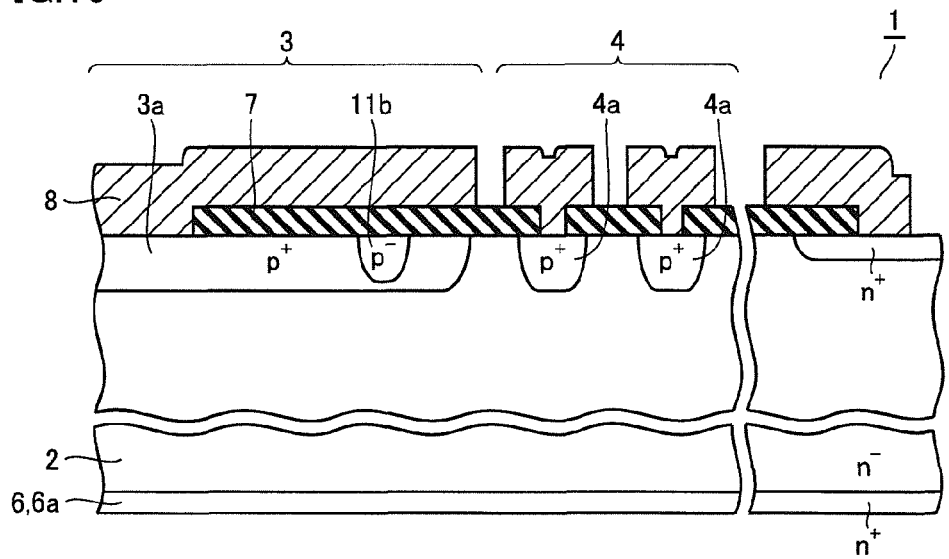
FIG. 10 is a cross-sectional view of a power semiconductor device having a diode in a third embodiment of the present invention.

As shown in FIG. 10, anode 3 includes a p$^+$-type diffusion region 3a and a p$^-$-type region 11b. P$^-$-type region 11b is formed, as a region of relatively high electrical resistance, in an end portion of anode 3. P$^-$-type region 11b is formed from one main surface to extend in a region shallower than p$^+$-type diffusion region 3a so that p$^-$-type region 11b has its lateral side and bottom side surrounded by p$^1$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n-type region (drift layer) of semiconductor substrate 2, and electrons are injected from n$^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, p$^+$-type diffusion region 3a and p$^-$-type region 11b are formed. P$^-$-type region 11b is lower in impurity concentration than p$^+$-type diffusion region 3a. P$^-$-type region 11b is formed, as a region having a higher electrical resistance than p$^+$-type diffusion region 3a, from one main surface to extend in a shallower region than p$^+$-type diffusion region 3a, so that it has its bottom side and lateral side surrounded by p$^+$-type diffusion region 3a. Namely, in the end portion of anode 3 of the diode, a region (p$^+$-type diffusion region 3a) of relatively low electrical resistance and a region (p$^-$-type region 11b) of relatively high electrical resistance are arranged.

Figure 11:
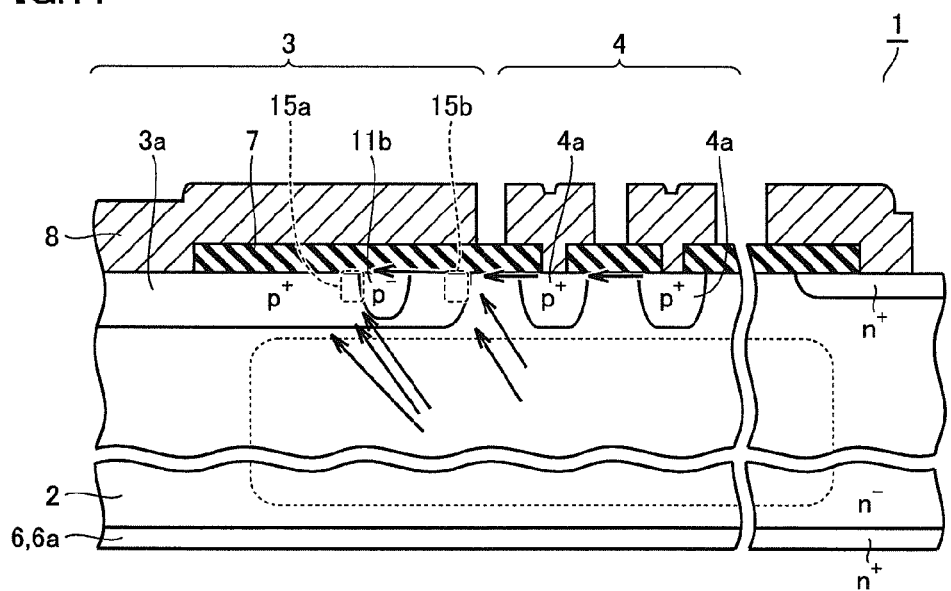
FIG. 11 is a cross-sectional view showing flow of carriers when a change is made from the ON state to the OFF state, for illustrating the function and effect in the third embodiment.

Accordingly, when the diode changes from the ON state to the OFF state, current concentratively flows into at least two dispersed regions (dotted-line boxes 15a, 15b) in anode 3 as shown in FIG. 11. Since the regions into which current concentratively flows are dispersed, concentration of the electric field is alleviated. Consequently, a temperature increase of the diode is suppressed and the diode can be prevented from being broken.

Fourth Embodiment

A power semiconductor device having a diode in a fourth embodiment of the present invention will be described.

Figure 12:
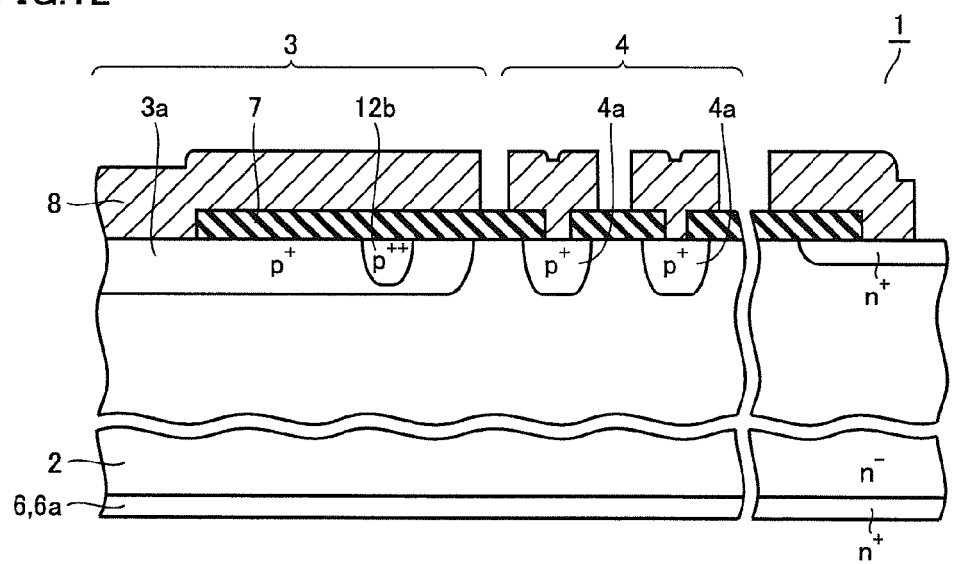
FIG. 12 is a cross-sectional view of a power semiconductor device having a diode in a fourth embodiment of the present invention.

As shown in FIG. 12, anode 3 includes a p$^+$-type diffusion region 3a and a p$^{++}$-type region 12b. P$^{++}$-type region 12b is formed, as a region of relatively low electrical resistance, in an end portion of anode 3. P$^{++}$-type region 12b is formed from one main surface to extend in a region shallower than p$^+$-type diffusion region 3a so that p$^{++}$-type region 12b has its lateral side and bottom side surrounded by p$^+$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n-type region (drift layer) of semiconductor substrate 2, and electrons are injected from n$^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, p$^+$-type diffusion region 3a and p$^{++}$-type region 12b are formed. P$^{++}$-type region 12b is higher in impurity concentration than p$^+$-type diffusion region 3a. P$^{++}$-type region 12b is formed, as a region having a lower electrical resistance than p$^+$-type diffusion region 3a, from one main surface to extend in a region shallower than p$^+$-type diffusion region 3a so that p$^{++}$-type region 12b has its bottom side and lateral side surrounded by p$^+$-type diffusion region 3a. Namely, in the end portion of anode 3 of the diode, a region (p$^{++}$-type region 12b) of relatively low electrical resistance and a region (p$^+$-type diffusion region 3a) of relatively high electrical resistance are arranged.

Figure 13:
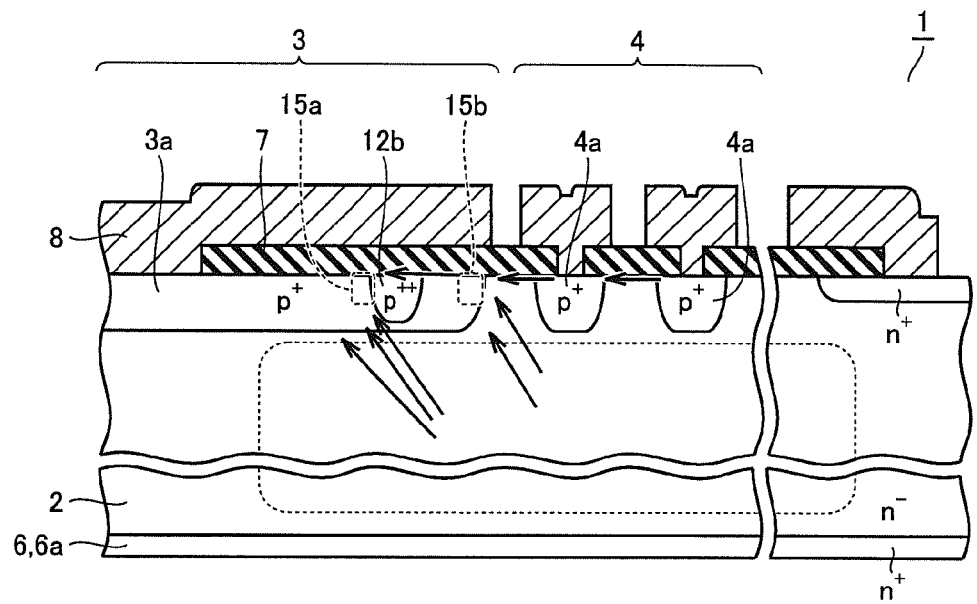
FIG. 13 is a cross-sectional view showing flow of carriers when a change is made from the ON state to the OFF state, for illustrating the function and effect in the fourth embodiment.

Accordingly, when the diode changes from the ON state to the OFF state, current concentratively flows into at least two dispersed regions (dotted-line boxes 15a, 15b) in anode 3 as shown in FIG. 13. Since the regions into which current concentratively flows are dispersed, concentration of the electric field is alleviated. Consequently, a temperature increase of the diode is suppressed and the diode can be prevented from being broken.

Fifth Embodiment

A power semiconductor device having a diode in a fifth embodiment of the present invention will be described.

Figure 14:
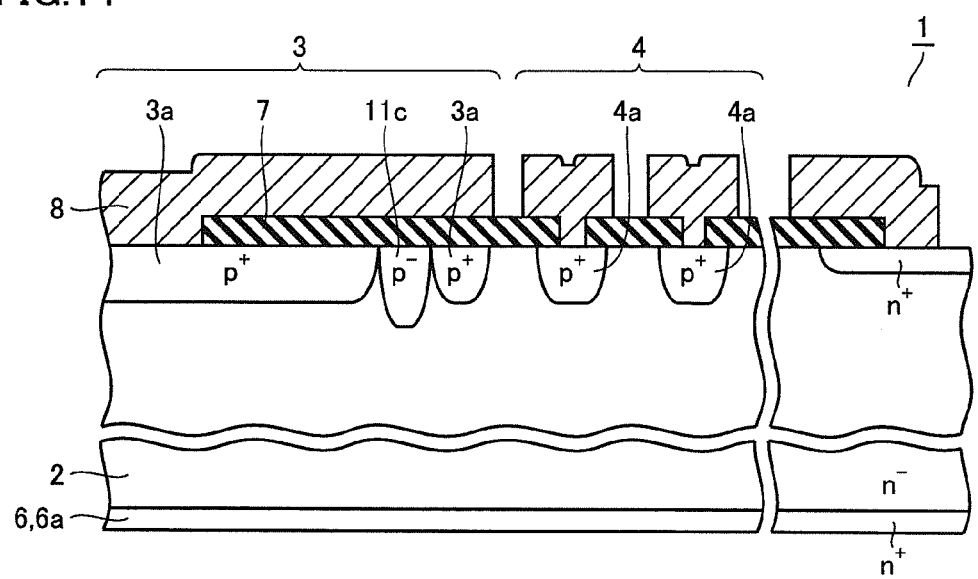
FIG. 14 is a cross-sectional view of a power semiconductor device having a diode in a fifth embodiment of the present invention.

As shown in FIG. 14, anode 3 includes a p$^+$-type diffusion region 3a and a p$^-$-type region 11c. P$^-$-type region 11c is formed, as a region of relatively high electrical resistance, in an end portion of anode 3. P$^-$-type region 11c is disposed so that it is sandwiched between p$^+$-type diffusion region 3a located on the guard ring 4 side and p$^+$-type diffusion region 3a located on the opposite side to the guard ring 4 side.

P$^-$-type region 11c is formed from one main surface to extend in a deeper region than p$^+$-type diffusion region 3a so that p$^-$-type region 11c protrudes downward to a greater extent than p$^+$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n-type region (drift layer) of semiconductor substrate 2, and electrons are injected from n$^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, $p^1$-type diffusion region 3a and $p^-$-type region 11c are formed. $P^-$-type region 11c is lower in impurity concentration than $p^+$-type diffusion region 3a. $P^-$-type region 11c is formed, as a region having a higher electrical resistance than $p^+$-type diffusion region 3a, so that $p^-$-type region 11c protrudes downward to a greater extent than $p^+$-type diffusion region 3a. Namely, in the end portion of anode 3 of the diode, a region ($p^+$-type diffusion region 3a) of relatively low electrical resistance and a region ($p^-$-type region 11c) of relatively high electrical resistance are arranged.

Figure 15:
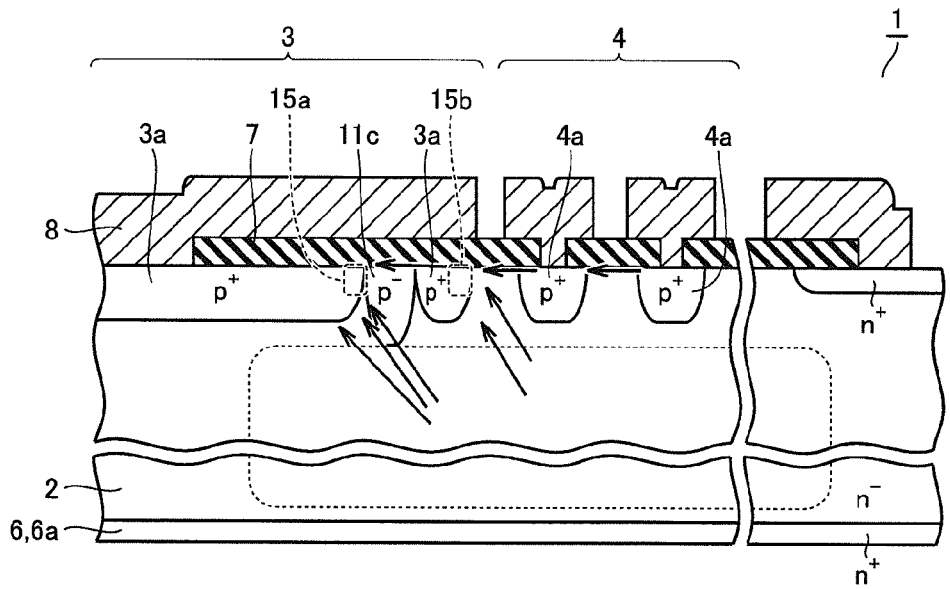
FIG. 15 is a cross-sectional view showing flow of carriers when a change is made from the ON state to the OFF state, for illustrating the function and effect in the fifth embodiment.

Accordingly, when the diode changes from the ON state to the OFF state, current concentratively flows into at least two dispersed regions (dotted-line boxes 15a, 15b) in anode 3 as shown in FIG. 15. Since the regions into which current concentratively flows are dispersed, concentration of the electric field is alleviated. Consequently, a temperature increase of the diode is suppressed and the diode can be prevented from being broken.

Moreover, in the above-described end portion of anode 3, $p^-$-type region 11c is formed that influences a forward voltage (VF) of the diode. The forward voltage is a voltage drop between the anode and the cathode of the diode when forward current is flown. As the impurity concentration of $p^-$-type region 11c is lowered, the forward voltage tends to increase.

In the above-described semiconductor device, $p^-$-type region 11c is formed from one main surface to extend in a deeper region than p+-type diffusion region 3a. Therefore, it is unnecessary to excessively lower the impurity concentration of $p^-$-type region 11c for allowing current in the OFF state to be dispersed, and thus an increase of the forward voltage can still be suppressed.

Sixth Embodiment

A power semiconductor device having a diode in a sixth embodiment of the present invention will be described.

Figure 16:
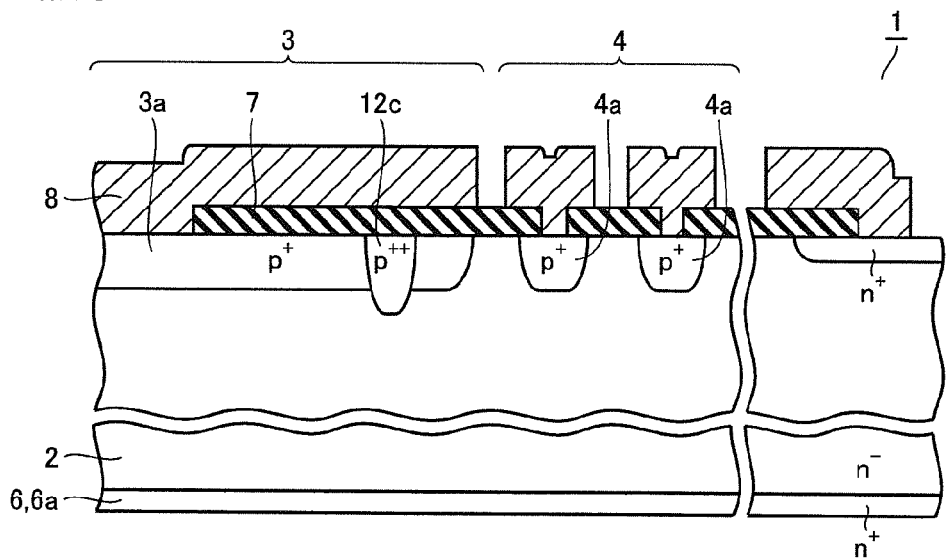
FIG. 16 is a cross-sectional view of a power semiconductor device having a diode in a sixth embodiment of the present invention.

As shown in FIG. 16, anode 3 includes a $p^+$-type diffusion region 3a and a $p^{++}$-type region 12c. $P^{++}$-type region 12c is formed, as a region of relatively low electrical resistance, in an end portion of anode 3. $P^{++}$-type region 12c is formed from one main surface to extend in a region deeper than $p^+$-type diffusion region 3a so that $p^{++}$-type region 12c protrudes downward to a greater extent than $p^-$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from $p^+$-type diffusion region 3a toward an n-type region (drift layer) of semiconductor substrate 2, and electrons are injected from $n^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, $p^+$-type diffusion region 3a and $p^{++}$-type region 12c are formed. $P^{++}$-type region 12c is higher in impurity concentration than $p^+$-type diffusion region 3a. $P^{++}$-type region 12c is formed, as a region having a lower electrical resistance than $p^+$-type diffusion region 3a, from one main surface to extend in a region deeper than $p^+$-type diffusion region 3a so that $p^{++}$-type region 12c extends downward to a greater extent than $p^+$-type diffusion region 3a. Namely, in the end portion of anode 3 of the diode, a region ($p^{++}$-type region 12c) of relatively low electrical resistance and a region ($p^+$-type diffusion region 3a) of relatively high electrical resistance are arranged.

Figure 17:
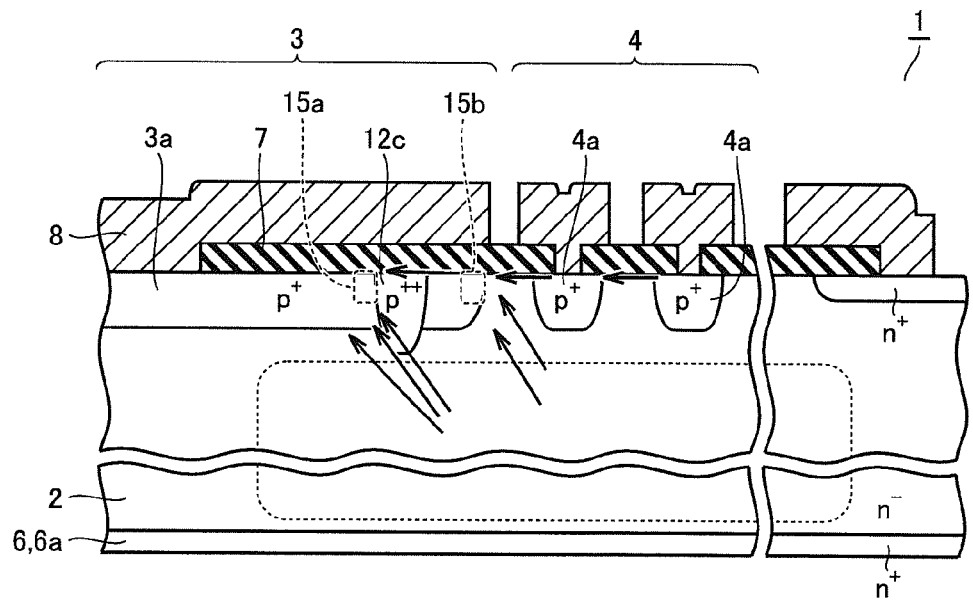
FIG. 17 is a cross-sectional view showing flow of carriers when a change is made from the ON state to the OFF state, for illustrating the function and effect in the sixth embodiment.

Accordingly, when the diode changes from the ON state to the OFF state, current concentratively flows into at least two dispersed regions (dotted-line boxes 15a, 15b) in anode 3 as shown in FIG. 17. Since the regions into which current concentratively flows are dispersed, concentration of the electric field is alleviated. Consequently, a temperature increase of the diode is suppressed and the diode can be prevented from being broken.

Moreover, in the above-described end portion of the anode, $p^{++}$-type region 12c is formed that influences a reverse recovery loss (recovery loss) which is caused due to reverse recovery current. As the impurity concentration of $p^{++}$-type region 12c is raised, the recovery loss tends to increase.

In the above-described semiconductor device, $p^{++}$-type region 12c is formed from one main surface to extend in a deeper region than $p^+$-type diffusion region 3a. Therefore, it is unnecessary to excessively raise the impurity concentration of $p^{++}$-type region 12c for allowing current in the OFF state to be dispersed, and thus an increase of the recovery loss can still be suppressed.

Seventh Embodiment

A power semiconductor device having a diode in a seventh embodiment of the present invention will be described.

Figure 18:
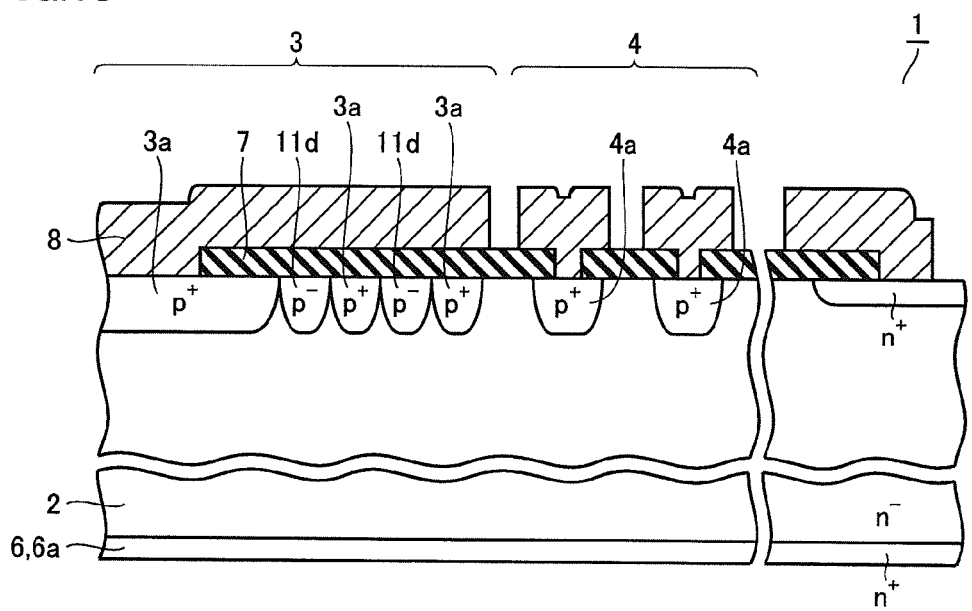
FIG. 18 is a cross-sectional view of a power semiconductor device having a diode in a seventh embodiment of the present invention.

As shown in FIG. 18, anode 3 includes a $p^+$-type diffusion region 3a and a $p^-$-type region 11d. A plurality of $p^-$-type regions 11d are formed, each as a region of relatively high electrical resistance, in an end portion of anode 3. A plurality of $p^-$-type regions 11d are each disposed so that it is sandwiched between $p^+$-type diffusion region 3a located on the guard ring 4 side and $p^+$-type diffusion region 3a located on the opposite side to the guard ring 4 side. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from $p^+$-type diffusion region 3a toward an n-type region (drift layer) of semiconductor substrate 2, and electrons are injected from $n^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, $p^1$-type diffusion region 3a and a plurality of $p^-$-type regions 11d are formed. $P^-$-type region 11d is lower in impurity concentration than $p^+$-type diffusion region 3a. A plurality of $p^-$-type regions 11d are each formed, as a region having a higher electrical resistance than $p^+$-type diffusion region 3a, so that $p^-$-type region 11d is sandwiched between $p^+$-type diffusion regions 3a. Namely, in the end portion of anode 3 of the diode, a region (p$^+$-type diffusion region 3a) of relatively low electrical resistance and a plurality of regions (p$^-$-type regions 11d) of relatively high electrical resistance are arranged.

Figure 19:
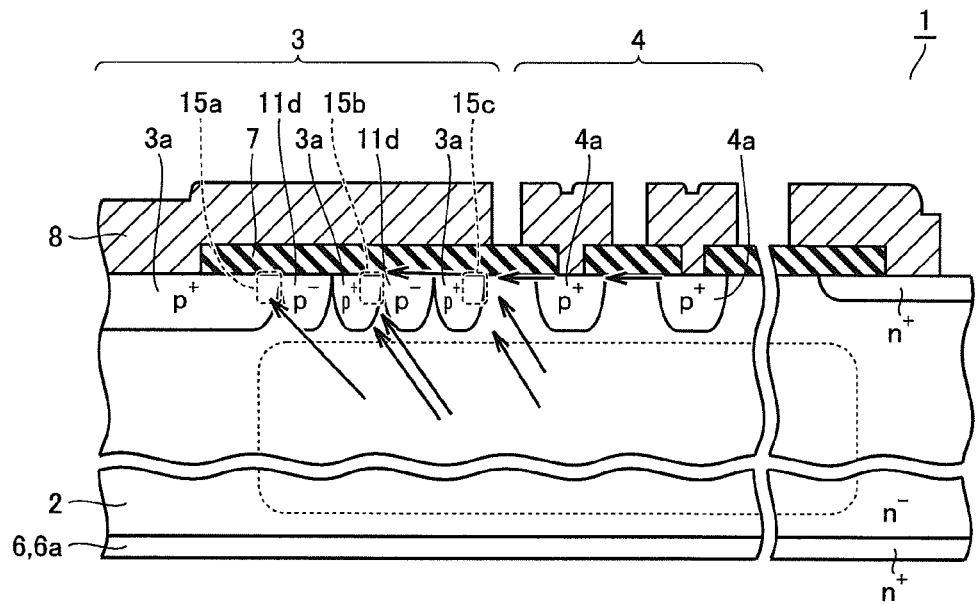
FIG. 19 is a cross-sectional view showing flow of carriers when a change is made from the ON state to the OFF state, for illustrating the function and effect in the seventh embodiment.

Accordingly, when the diode changes from the ON state to the OFF state, current concentratively flows into at least three dispersed regions (dotted-line boxes 15a, 15b, 15c) in anode 3 as shown in FIG. 19. Since the regions into which current concentratively flows are further dispersed, concentration of the electric field is further alleviated. Consequently, a temperature increase of the diode is suppressed and the diode can be prevented from being broken.

Eighth Embodiment

A power semiconductor device having a diode in an eighth embodiment of the present invention will be described.

Figure 20:
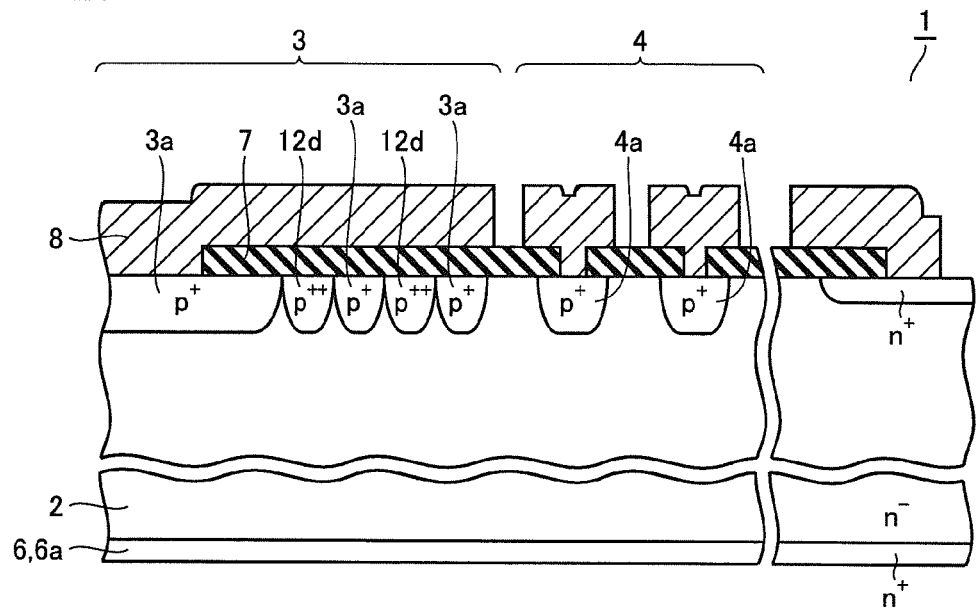
FIG. 20 is a cross-sectional view of a power semiconductor device having a diode in an eighth embodiment of the present invention.

As shown in FIG. 20, anode 3 includes a p$^+$-type diffusion region 3a and a p$^{++}$-type region 12d. A plurality of p$^{++}$-type regions 12d are formed, each as a region of relatively low electrical resistance, in an end portion of anode 3. A plurality of p$^{++}$-type regions 12d are each formed so that it is sandwiched between p$^+$-type diffusion region 3a located on the guard ring 4 side and p$^+$-type diffusion region 3a located on the opposite side to the guard ring 4 side. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n-type region (drift layer) of semiconductor substrate 2, and electrons are injected from n$^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of the anode in the above-described semiconductor device, p$^+$-type diffusion region 3a and a plurality of p$^{++}$-type regions 12d are formed. P$^{++}$-type region 12d is higher in impurity concentration than p$^+$-type diffusion region 3a. A plurality of p$^{++}$-type regions 12d are each formed, as a region having a lower electrical resistance than p$^+$-type diffusion region 3a, so that it is sandwiched between p$^+$-type diffusion regions 3a. Namely, in the end portion of anode 3 of the diode, a region (p$^+$-type diffusion region 3a) of relatively high electrical resistance and a plurality of regions (p$^{++}$-type regions 12d) of relatively low electrical resistance are arranged.

Figure 21:
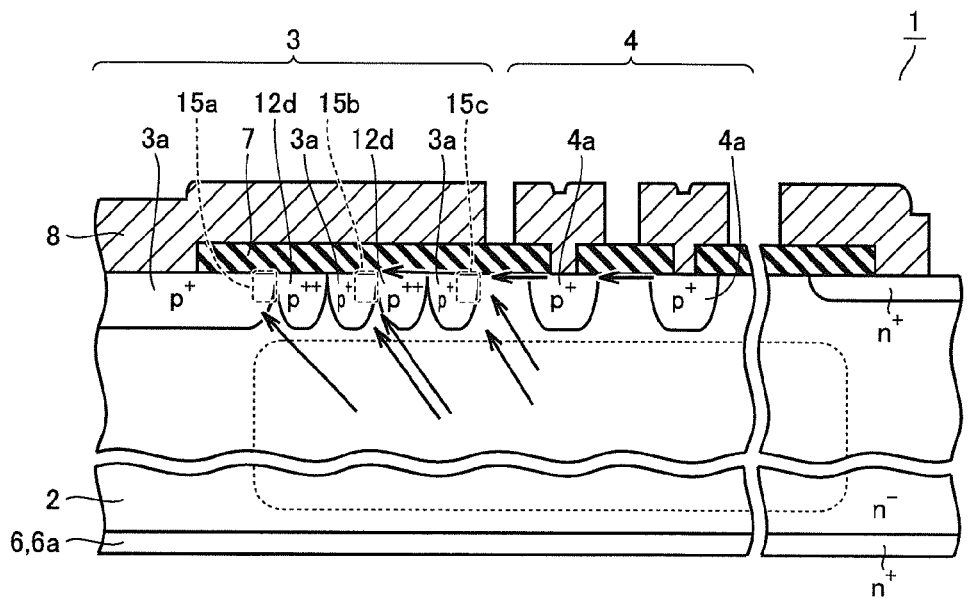
FIG. 21 is a cross-sectional view showing flow of carriers when a change is made from the ON state to the OFF state, for illustrating the function and effect in the eighth embodiment.

Accordingly, when the diode changes from the ON state to the OFF state, current concentratively flows into at least three dispersed regions (dotted-line boxes 15a, 15b, 15c) in anode 3 as shown in FIG. 21. Since the regions into which current concentratively flows are further dispersed, concentration of the electric field is further alleviated. Consequently, a temperature increase of the diode is suppressed and the diode can be prevented from being broken.

Ninth Embodiment

A power semiconductor device having a diode in a ninth embodiment of the present invention will be described.

Figure 22:
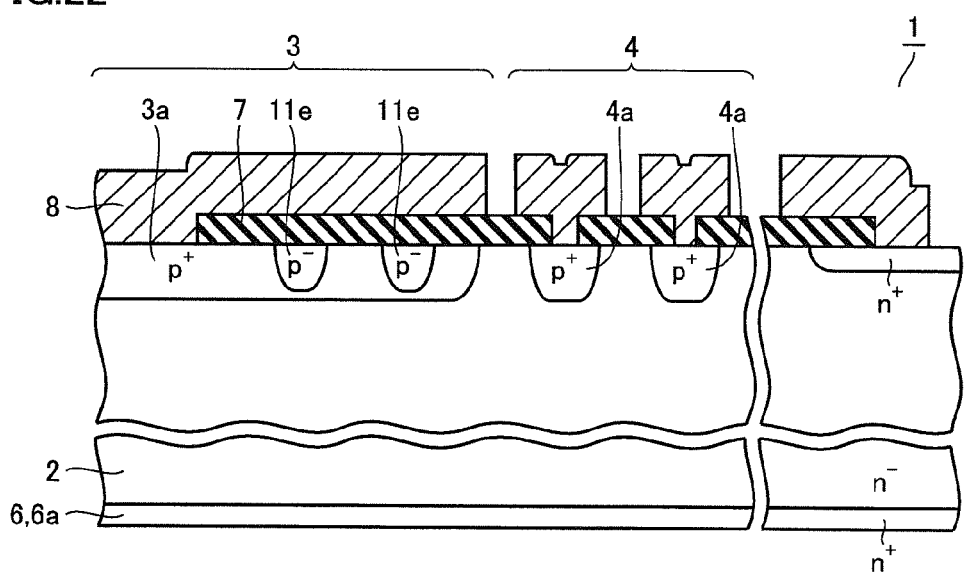
FIG. 22 is a cross-sectional view of a power semiconductor device having a diode in a ninth embodiment of the present invention.

As shown in FIG. 22, anode 3 includes a p$^+$-type diffusion region 3a and a p$^-$-type region 11e. A plurality of p$^-$-type regions 11e are formed, each as a region of relatively high electrical resistance, in an end portion of anode 3. A plurality of p$^-$-type regions 11e are each formed from one main surface to extend in a region shallower than p$^+$-type diffusion region 3a so that p$^-$-type region 11e has its lateral side and bottom side surrounded by p$^+$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n-type region (drift layer) of semiconductor substrate 2, and electrons are injected from n$^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, p$^+$-type diffusion region 3a and a plurality of p$^-$-type regions 11e are formed. P$^-$-type region 11e is lower in impurity concentration than p$^+$-type diffusion region 3a. A plurality of p$^-$-type regions 11e are each formed, as a region having a higher electrical resistance than p$^+$-type diffusion region 3a, so that p$^-$-type region 11e has its bottom side and lateral side surrounded by p$^+$-type diffusion regions 3a. Namely, in the end portion of anode 3 of the diode, a region (p$^+$-type diffusion region 3a) of relatively low electrical resistance and a plurality of regions (p$^-$-type regions 11e) of relatively high electrical resistance are arranged.

Figure 23:
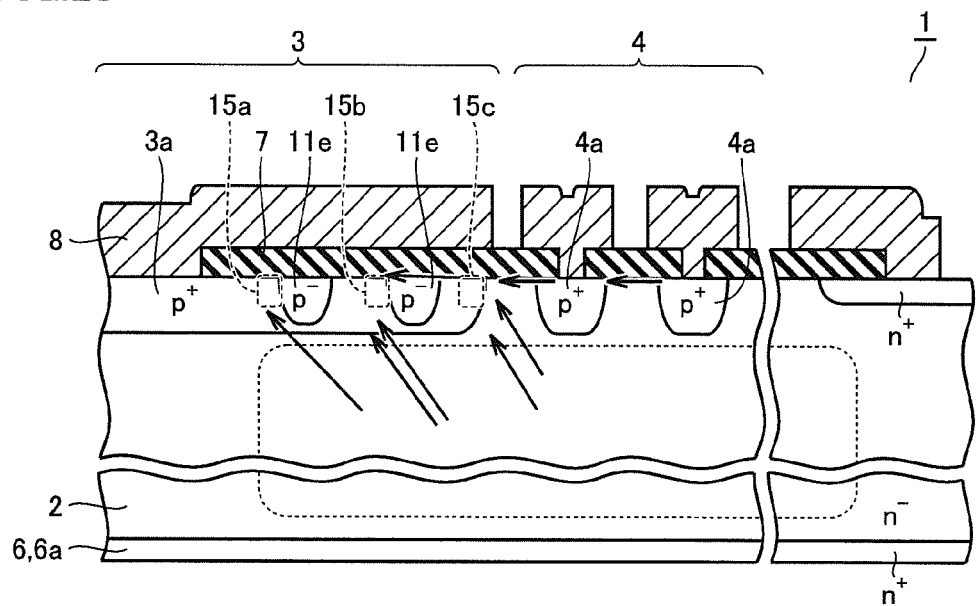
FIG. 23 is a cross-sectional view showing flow of carriers when a change is made from the ON state to the OFF state, for illustrating the function and effect in the ninth embodiment.

Accordingly, when the diode changes from the ON state to the OFF state, current concentratively flows into at least three dispersed regions (dotted-line boxes 15a, 15b, 15c) in anode 3 as shown in FIG. 23. Since the regions into which current concentratively flows are further dispersed, concentration of the electric field is further alleviated. Consequently, a temperature increase of the diode is suppressed and the diode can be prevented from being broken.

Tenth Embodiment

A power semiconductor device having a diode in a tenth embodiment of the present invention will be described.

Figure 24:
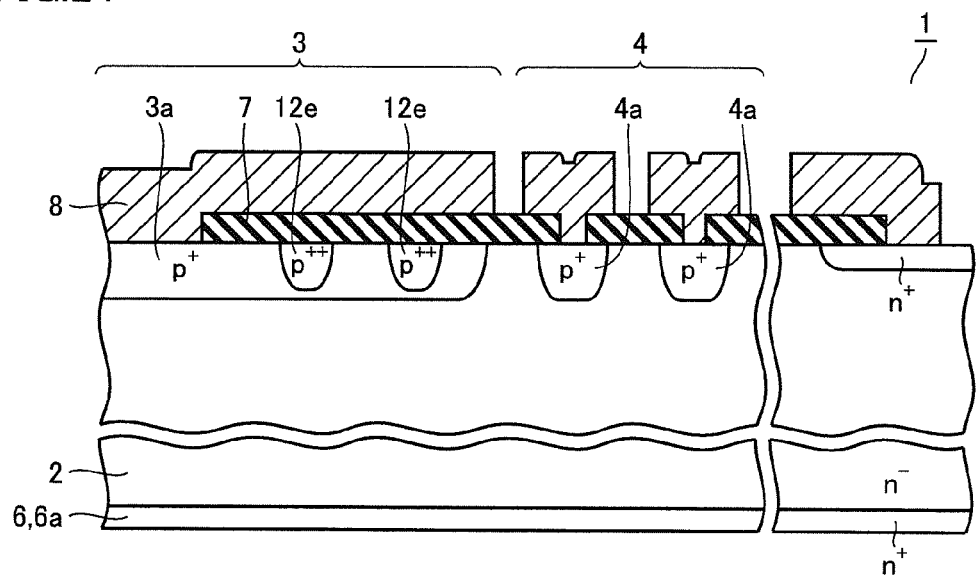
FIG. 24 is a cross-sectional view of a power semiconductor device having a diode in a tenth embodiment of the present invention.

As shown in FIG. 24, anode 3 includes a p$^+$-type diffusion region 3a and a p$^{++}$-type region 12e. A plurality of p$^{++}$-type regions 12e are formed, each as a region of relatively low electrical resistance, in an end portion of anode 3. A plurality of p$^{++}$-type regions 12e are each formed from one main surface to extend in a region shallower than p$^+$-type diffusion region 3a, so that p$^{++}$-type region 12e has its lateral side and bottom side surrounded by p$^+$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from p$^+$-type diffusion region 3a toward an n-type region (drift layer) of semiconductor substrate 2, and electrons are injected from n$^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, $p^+$-type diffusion region 3a and a plurality of $p^+$-type regions 12e are formed. $P^{++}$-type region 12e is higher in impurity concentration than $p^+$-type diffusion region 3a. A plurality of $p^{++}$-type regions 12e are each formed, as a region having a lower electrical resistance than $p^+$-type diffusion region 3a, so that $p^{++}$-type regions 12e has its bottom side and lateral side surrounded by $p^+$-type diffusion region 3a. Namely, in the end portion of anode 3 of the diode, a plurality of regions ($p^{++}$-type regions 12e) of relatively low electrical resistance and a region ($p^+$-type diffusion region 3a) of relatively high electrical resistance are arranged.

Figure 25:
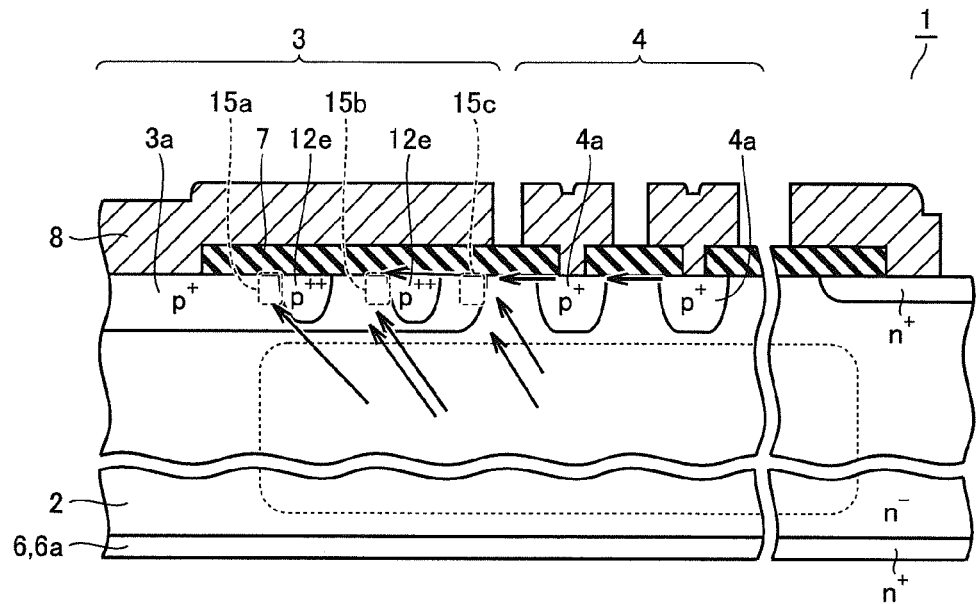
FIG. 25 is a cross-sectional view showing flow of carriers when a change is made from the ON state to the OFF state, for illustrating the function and effect in the tenth embodiment.

Accordingly, when the diode changes from the ON state to the OFF state, current concentratively flows into at least three dispersed regions (dotted-line boxes 15a, 15b, 15c) in anode 3 as shown in FIG. 25. Since the regions into which current concentratively flows are further dispersed, concentration of the electric field is further alleviated. Consequently, a temperature increase of the diode is suppressed and the diode can be prevented from being broken.

Eleventh Embodiment

A power semiconductor device having a diode in an eleventh embodiment of the present invention will be described.

Figure 26:
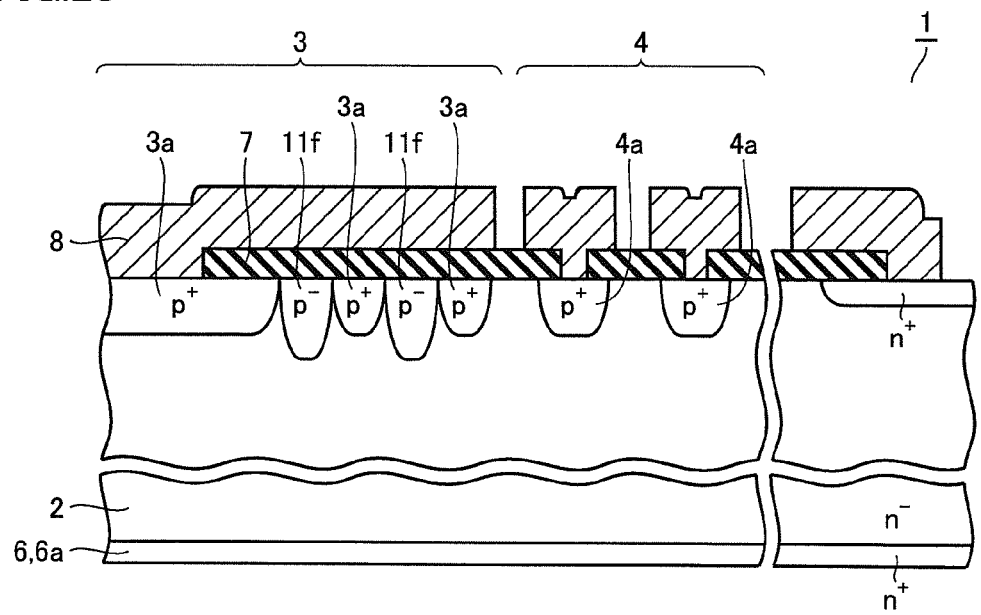
FIG. 26 is a cross-sectional view of a power semiconductor device having a diode in an eleventh embodiment of the present invention.

As shown in FIG. 26, anode 3 includes a $p^+$-type diffusion region 3a and a $p^-$-type region 11f. A plurality of $p^-$-type regions 11f are formed, each as a region of relatively high electrical resistance, in an end portion of anode 3. A plurality of $p^-$-type regions 11f are each formed from one main surface to extend in a deeper region than $p^+$-type diffusion region 3a so that $p^-$-type region 11f protrudes downward to a greater extent than $p^+$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from $p^+$-type diffusion region 3a toward an n-type region (drift layer) of semiconductor substrate 2, and electrons are injected from $n^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, $p^+$-type diffusion region 3a and a plurality of $p^-$-type regions 11f are formed. $P^-$-type region 11f is lower in impurity concentration than $p^+$-type diffusion region 3a. A plurality of $p^-$-type regions 11f are each formed, as a region having a higher electrical resistance than $p^+$-type diffusion region 3a, so that $p^-$-type region 11f protrudes downward to a greater extent than $p^+$-type diffusion region 3a. Namely, in the end portion of anode 3 of the diode, a region ($p^+$-type diffusion region 3a) of relatively low electrical resistance and a plurality of regions ($p^-$-type regions 11f) of relatively high electrical resistance are arranged.

Figure 27:
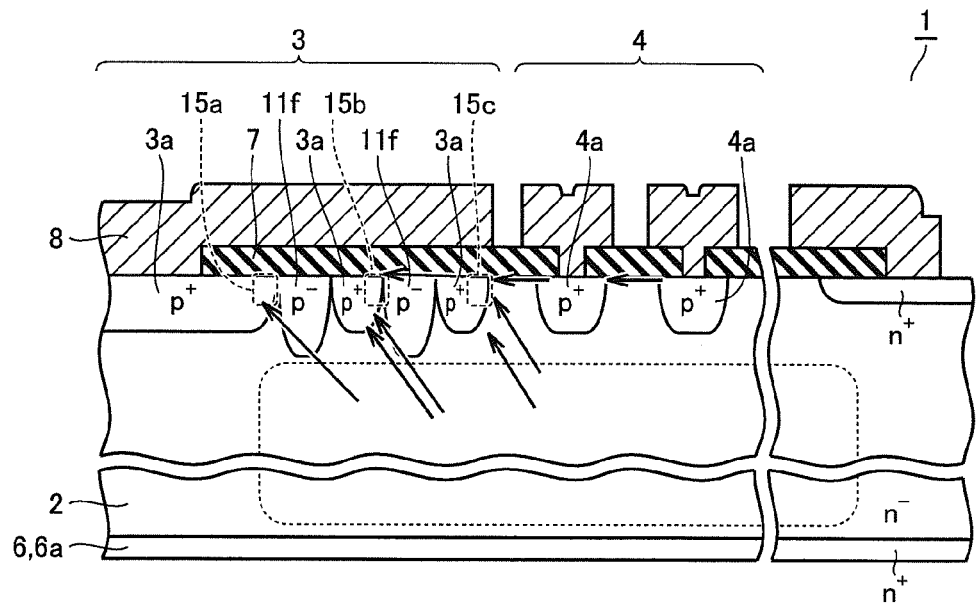
FIG. 27 is a cross-sectional view showing flow of carriers when a change is made from the ON state to the OFF state, for illustrating the function and effect in the eleventh embodiment.

Accordingly, when the diode changes from the ON state to the OFF state, current concentratively flows into at least three dispersed regions (dotted-line boxes 15a, 15b, 15c) in anode 3 as shown in FIG. 27. Since the regions into which current concentratively flows are further dispersed, concentration of the electric field is further alleviated. Consequently, a temperature increase of the diode is suppressed and the diode can be prevented from being broken.

Twelfth Embodiment

A power semiconductor device having a diode in a twelfth embodiment of the present invention will be described.

Figure 28:
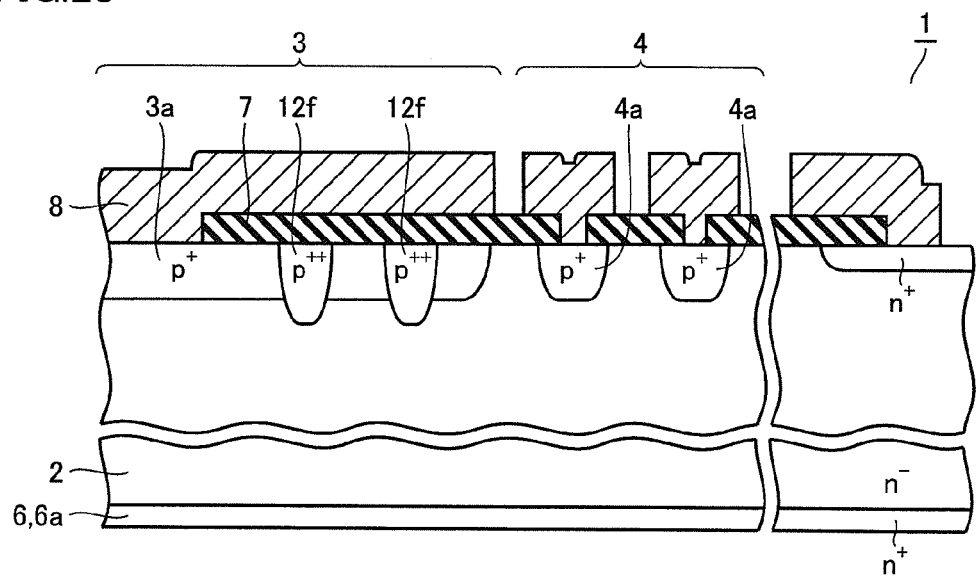
FIG. 28 is a cross-sectional view of a power semiconductor device having a diode in a twelfth embodiment of the present invention.

As shown in FIG. 28, anode 3 includes a $p^+$-type diffusion region 3a and a $p^{11}$-type region 12f. A plurality of $p^{11}$-type regions 12f are formed, each as a region of relatively low electrical resistance, in an end portion of anode 3. A plurality of $p^{++}$-type regions 12f are each formed from one main surface to extend in a deeper region than $p^+$-type diffusion region 3a so that $p^{++}$-type region 12f protrudes downward to a greater extent than $p^+$-type diffusion region 3a. Features other than the above-described ones are similar to those of the semiconductor device shown in FIG. 1. Therefore, the same components are denoted by the same reference characters, and the description thereof will not be repeated.

In the following, an operation of the above-described semiconductor device will briefly be described. When the diode is the ON state, holes are injected from $p^+$-type diffusion region 3a toward an n-type region (drift layer) of semiconductor substrate 2, and electrons are injected from $n^+$-type high-concentration region 6a toward the drift layer of semiconductor substrate 2. In contrast, when the diode is to be changed from the ON state to the OFF state, of the carriers accumulated in the drift layer in the ON state, electrons are discharged from cathode 6 and holes are discharged from anode 3, which causes the OFF state.

In the end portion of anode 3 in the above-described semiconductor device, $p^+$-type diffusion region 3a and a plurality of $p^{++}$-type regions 12f are formed. $P^{++}$-type region 12f is higher in impurity concentration than $p^+$-type diffusion region 3a. A plurality of $p^{++}$-type regions 12f are each formed so that it protrudes downward to a greater extent than $p^+$-type diffusion region 3a. Namely, in the end portion of anode 3 of the diode, a plurality of regions ($p^{++}$-type regions 12f) of relatively low electrical resistance and a region ($p^-$-type diffusion region 3a) of relatively high electrical resistance are arranged.

Figure 29:
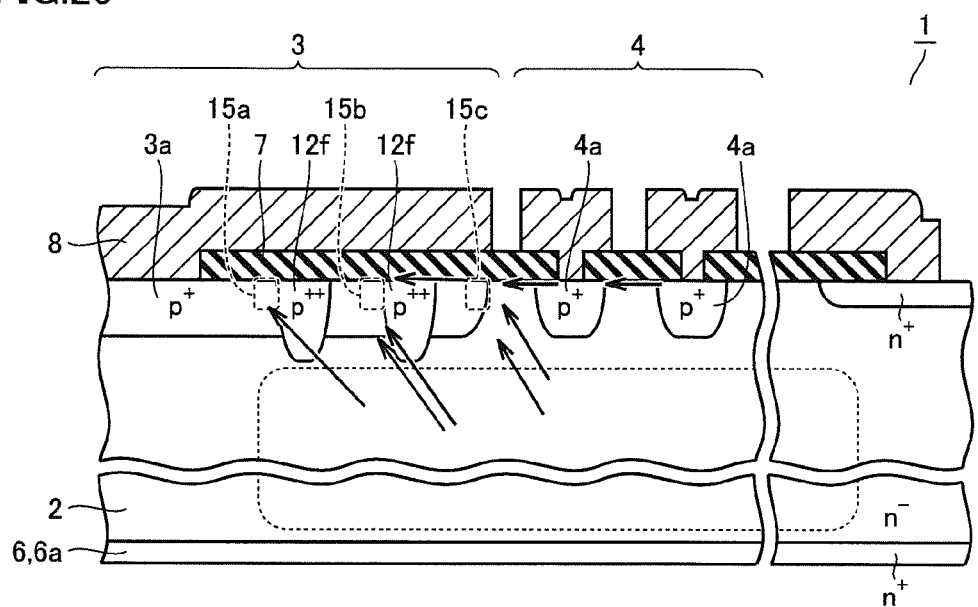
FIG. 29 is a cross-sectional view showing flow of carriers when a change is made from the ON state to the OFF state, for illustrating the function and effect in the twelfth embodiment.

Accordingly, when the diode changes from the ON state to the OFF state, current concentratively flows into at least three dispersed regions (dotted-line boxes 15a, 15b, 15c) in anode 3 as shown in FIG. 29. Since the regions into which current concentratively flows are further dispersed, concentration of the electric field is further alleviated. Consequently, a temperature increase of the diode is suppressed and the diode can be prevented from being broken.

Regarding the above-described embodiments, it has been described that $p^-$-type regions 11a to 11f or $p^{++}$-type regions 12a to 12f are each formed from a main surface of the semiconductor substrate to a predetermined depth in the end portion of anode 3. As long as regions into which current concentratively flows when the diode changes from the ON state to the OFF state can be dispersed, the present invention is not limited to each of the above-described configurations.

Although the present invention has been described and illustrated in detail, it is clearly understood that the same is by way of illustration and example only and is not to be taken by way of limitation, the scope of the present invention being interpreted by the terms of the appended claims.

The present invention is effectively used for a power semiconductor device having a diode.

What is claimed is:

1. A semiconductor device, comprising:
a semiconductor substrate of a first conductivity type having a first main surface and a second main surface opposite to each other;
an anode formed in said first main surface of said semiconductor substrate;
an anode electrode in contact with the anode;
a guard ring formed in said first main surface of said semiconductor substrate and at a distance from an outer periphery of said anode to surround said anode; and
a cathode of the first conductivity type formed in said second main surface of said semiconductor substrate,
said anode including, in its end portion located at said outer periphery, a region of relatively high impurity concentration and a region of relatively low impurity concentration; wherein
in said end portion of said anode,
a first impurity region of a second conductivity type having a first impurity concentration is formed, as one of said region of relatively high impurity concentration and said region of relatively low impurity concentration, from said first main surface of said semiconductor substrate to a first depth,
a second impurity region of the second conductivity type having a second impurity concentration different from said first impurity concentration is formed, as the other of said region of relatively high impurity concentration and said region of relatively low impurity concentration, from said first main surface of said semiconductor substrate to a second depth,
said second depth is deeper than said first depth, and
said second impurity region is formed to protrude downward to a greater extent than said first impurity region;
at least one or both of the first and second impurity regions makes contact with an insulating film interposed between the anode electrode and the impurity regions; and
wherein one of the first impurity region and the second impurity region is formed on both sides of the other impurity region.

2. The semiconductor device according to claim 1, wherein a plurality of said second impurity regions are formed,
a plurality of said second impurity regions are spaced from each other along a direction connecting said anode and said guard ring, and
a plurality of said second impurity regions are each formed to protrude downward to a greater extent than said first impurity region.

3. The semiconductor device according to claim 1, wherein said second impurity concentration is lower than said first impurity concentration.

4. The semiconductor device according to claim 1, wherein said second impurity concentration is higher than said first impurity concentration.

5. A semiconductor device, comprising:
a semiconductor substrate of a first conductivity type having a first main surface and a second main surface opposite to each other;
an anode formed in said first main surface of said semiconductor substrate;
an anode electrode in contact with the anode;
a guard ring formed in said first main surface of said semiconductor substrate and at a distance from an outer periphery of said anode to surround said anode; and
a cathode of the first conductivity type formed in said second main surface of said semiconductor substrate,
said anode including, in its end portion located at said outer periphery, a region of relatively high impurity concentration and a region of relatively low impurity concentration;
wherein in said end portion of said anode,
a first impurity region of a second conductivity type having a first impurity concentration is formed, as one of said region of relatively high impurity concentration and said region of relatively low impurity concentration, from said first main surface of said semiconductor substrate to a first depth,
a second impurity region of the second conductivity type having a second impurity concentration different from said first impurity concentration is formed, as the other of said region of relatively high impurity concentration and said region of relatively low impurity concentration, from said first main surface of said semiconductor substrate to a second depth,
said second depth is shallower than said first depth, and
said second impurity region is formed with its bottom side and lateral side surrounded by said first impurity region;
at least one or both of the first and second impurity regions makes contact with an insulating film interposed between the anode electrode and the impurity regions; and
wherein one of the first impurity region and the second impurity region is formed on both sides of the other impurity region.

6. The semiconductor device according to claim 5, wherein a plurality of said second impurity regions are formed,
the plurality of said second impurity regions are spaced from each other along a direction connecting said anode and said guard ring, and
the plurality of said second impurity regions are each formed with its bottom side and lateral side surrounded by said first impurity region.

7. The semiconductor device according to claim 5, wherein said second impurity concentration is lower than said first impurity concentration.

8. The semiconductor device according to claim 5, wherein said second impurity concentration is higher than said first impurity concentration.

9. The semiconductor device according to claim 5, wherein the anode electrode is directly above both impurity regions, and only one impurity region makes direct physical contact with the anode electrode.

* * * * *